(12) United States Patent
King

(10) Patent No.: US 11,937,428 B2
(45) Date of Patent: Mar. 19, 2024

(54) MEMORY ARRAYS AND METHODS USED IN FORMING A MEMORY ARRAY COMPRISING STRINGS OF MEMORY CELLS

(71) Applicant: Lodestar Licensing Group LLC, Evanston, IL (US)

(72) Inventor: Matthew J. King, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 17/516,867

(22) Filed: Nov. 2, 2021

(65) Prior Publication Data
US 2022/0059566 A1 Feb. 24, 2022

Related U.S. Application Data

(62) Division of application No. 16/657,498, filed on Oct. 18, 2019, now Pat. No. 11,195,850.

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02164* (2013.01); *H01L 21/0217* (2013.01); *H01L 21/02178* (2013.01); *H01L 21/02636* (2013.01); *H01L 21/31111* (2013.01); *H01L 21/31144* (2013.01); *H01L 21/32133* (2013.01);
(Continued)

(58) Field of Classification Search
CPC ........ H10B 43/27; H10B 41/27; H10B 43/10; H10B 43/20; H01L 21/02164; H01L 21/0217; H01L 21/02636; H01L 21/31111; H01L 21/31144; H01L 21/32133; H01L 21/32139; H01L 29/40114; H01L 29/40117
See application file for complete search history.

(56) References Cited

U.S. PATENT DOCUMENTS 9,997,353 B1 6/2018 Kumar et al.
10,290,643 B1 5/2019 Kai et al.
(Continued)

FOREIGN PATENT DOCUMENTS

WO WO 2020/252892 12/2020

*Primary Examiner* — Shih Tsun A Chou
(74) *Attorney, Agent, or Firm* — Brooks, Cameron & Huebsch, PLLC

(57) ABSTRACT

A method used in forming a memory array comprising strings of memory cells comprises forming a stack comprising vertically-alternating first tiers and second tiers. Intervening material is formed into the stack laterally-between and longitudinally-along immediately-laterally-adjacent memory block regions. The forming of the intervening material comprises forming pillars laterally-between and longitudinally-spaced-along the immediately-laterally-adjacent memory-block regions. The pillars individually extend through multiple of each of the first tiers and the second tiers. After forming the pillars, an intervening opening is formed individually alongside and between immediately-longitudinally-adjacent of the pillars. Fill material is formed in the intervening openings. Other embodiments, including structure, are disclosed.

18 Claims, 18 Drawing Sheets

(51) Int. Cl.
- *H01L 21/28* (2006.01)
- *H01L 21/311* (2006.01)
- *H01L 21/3213* (2006.01)
- *H10B 41/10* (2023.01)
- *H10B 41/27* (2023.01)
- *H10B 43/10* (2023.01)

(52) U.S. Cl.
CPC .. *H01L 21/32139* (2013.01); *H01L 29/40114* (2019.08); *H01L 29/40117* (2019.08); *H10B 41/10* (2023.02); *H10B 41/27* (2023.02); *H10B 43/10* (2023.02)

(56) References Cited

U.S. PATENT DOCUMENTS

| | | |
|---|---|---|
| 2012/0119287 A1 | 5/2012 | Park et al. |
| 2012/0168829 A1 | 7/2012 | Zhong et al. |
| 2012/0208347 A1* | 8/2012 | Hwang ............... H01L 21/762 |
| | | 257/E21.546 |
| 2015/0206900 A1 | 7/2015 | Nam et al. |
| 2015/0303214 A1 | 10/2015 | Kim et al. |
| 2015/0340377 A1* | 11/2015 | Lee .................... H10B 41/27 |
| | | 257/314 |
| 2016/0049421 A1 | 2/2016 | Zhang et al. |
| 2016/0336338 A1 | 11/2016 | Song et al. |
| 2016/0336340 A1 | 11/2016 | Song et al. |
| 2017/0250193 A1 | 8/2017 | Huo |
| 2017/0256645 A1 | 9/2017 | Chung et al. |
| 2018/0261616 A1 | 9/2018 | Cho et al. |
| 2019/0326313 A1 | 10/2019 | Cui et al. |
| 2019/0393238 A1 | 12/2019 | Lim et al. |
| 2020/0058673 A1 | 2/2020 | Nishikawa et al. |
| 2020/0119036 A1 | 4/2020 | King et al. |
| 2021/0202324 A1 | 7/2021 | Scarbrough et al. |

\* cited by examiner

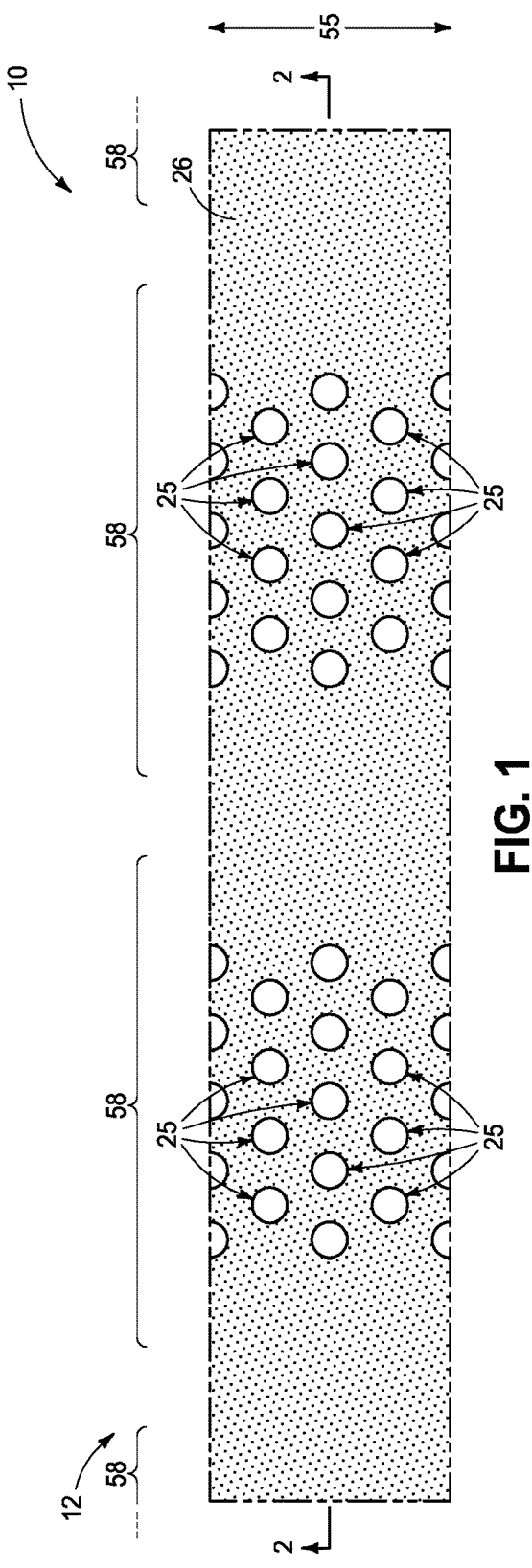
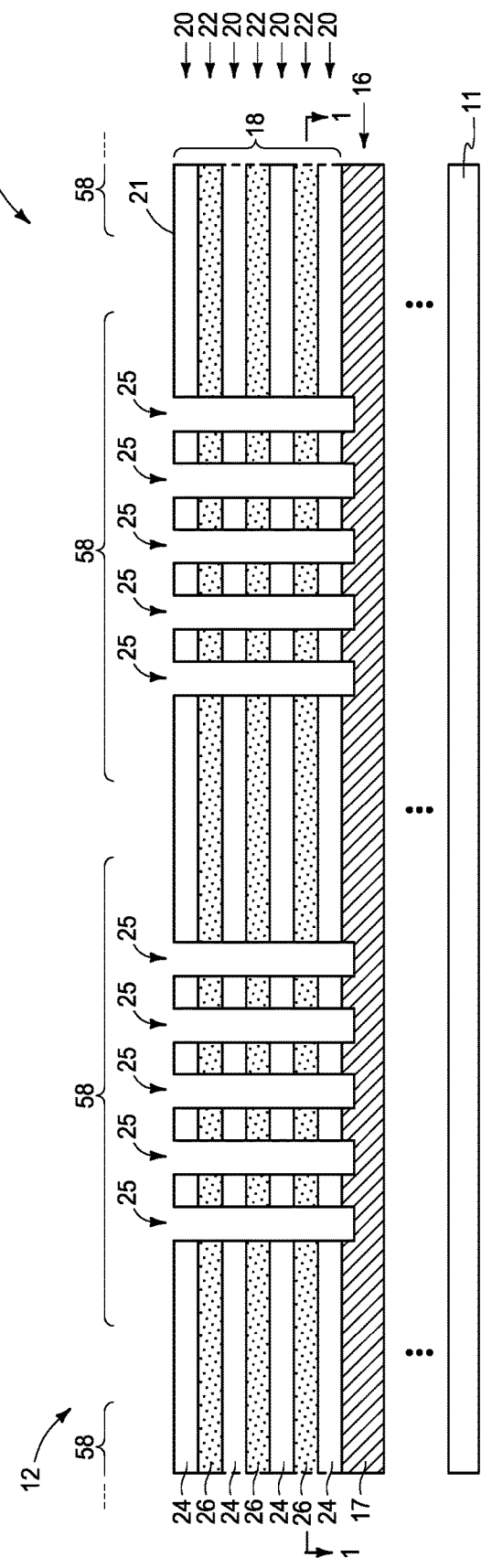

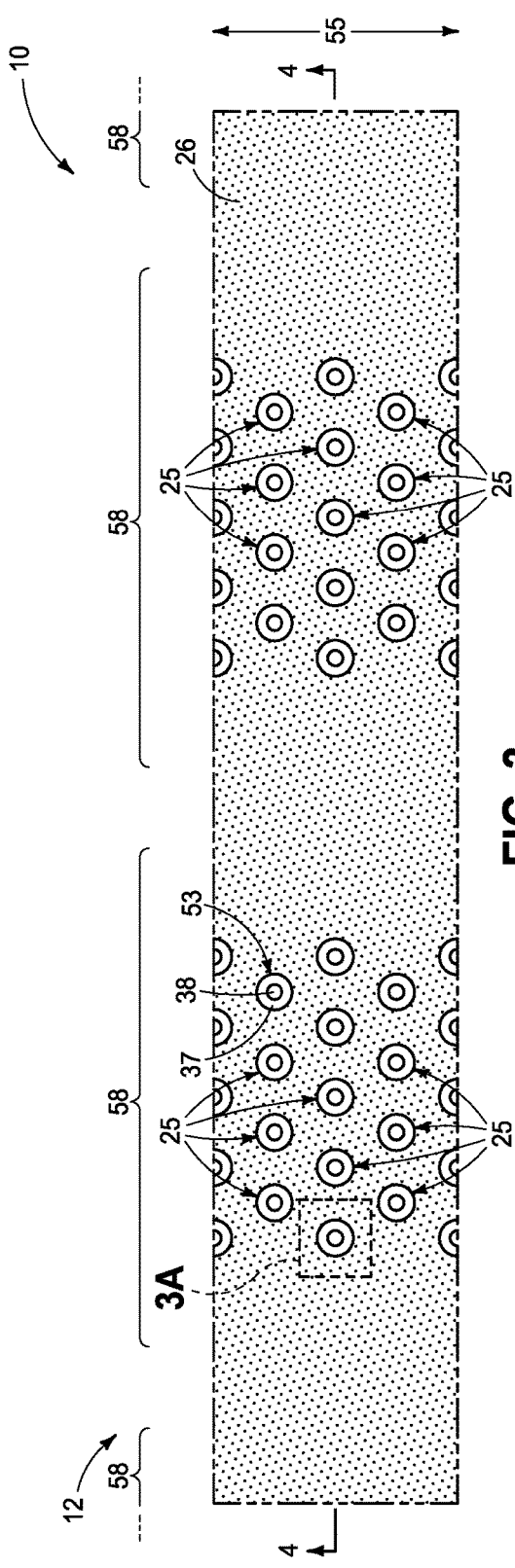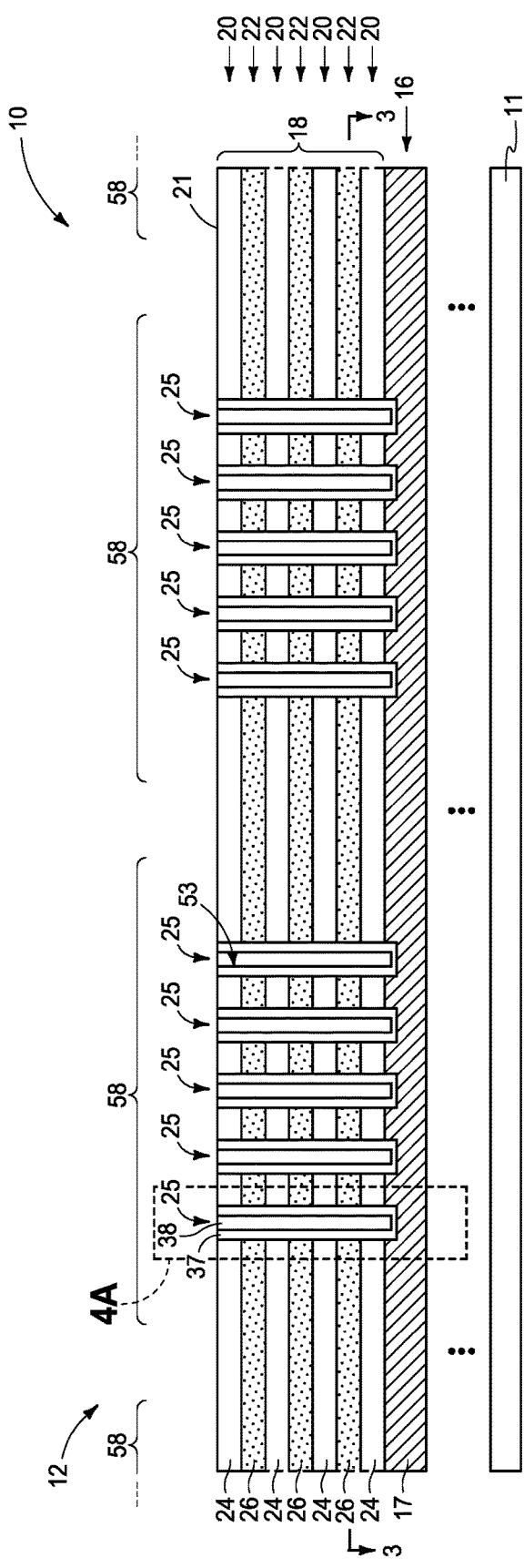

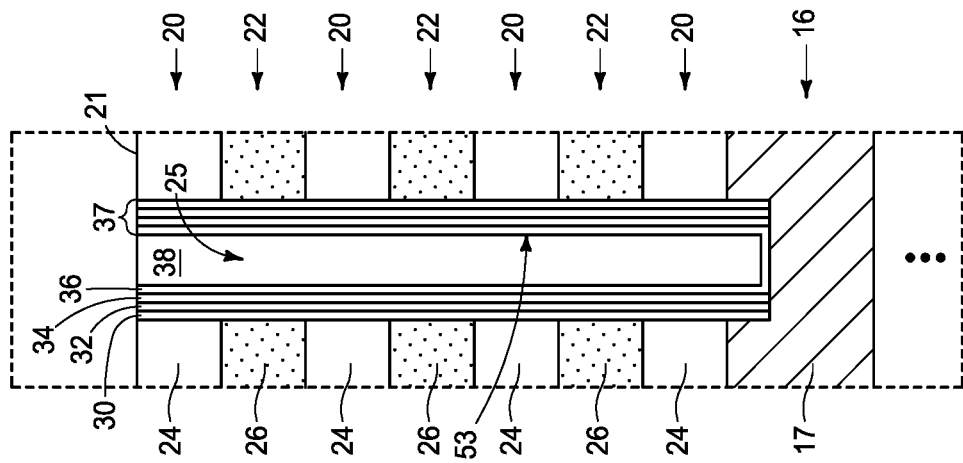
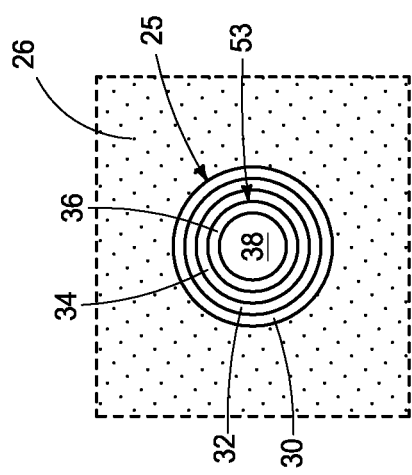

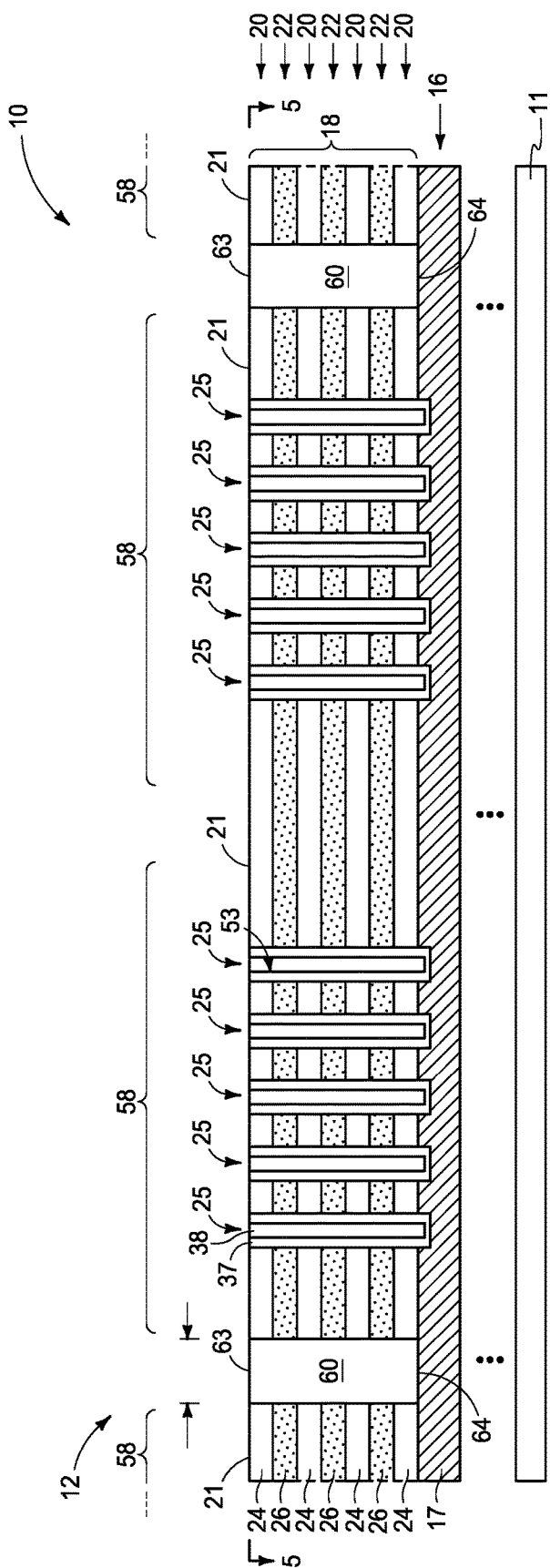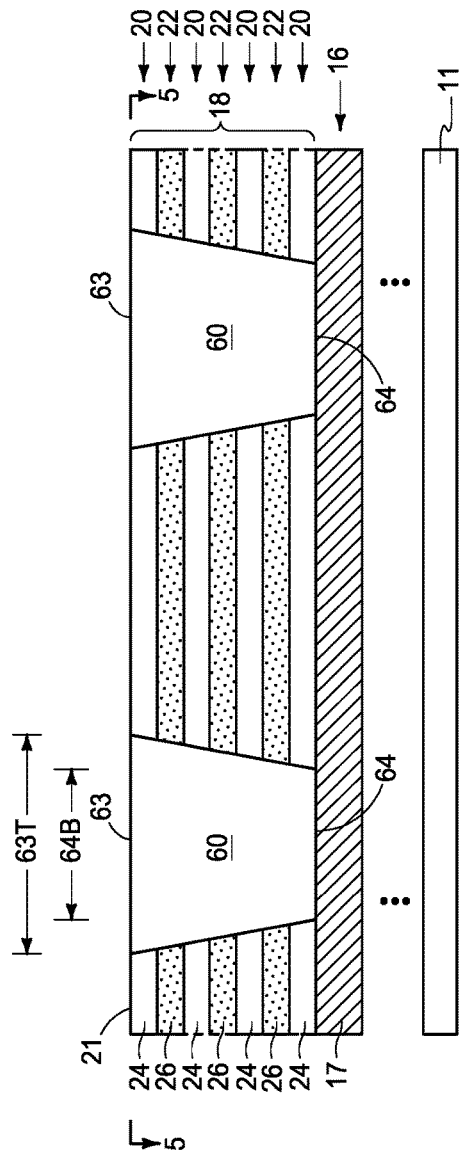
FIG. 6
FIG. 7

MEMORY ARRAYS AND METHODS USED IN FORMING A MEMORY ARRAY COMPRISING STRINGS OF MEMORY CELLS

RELATED PATENT DATA

This patent resulted from a divisional application of U.S. patent application Ser. No. 16/657,498, filed Oct. 18, 2019, entitled "Memory Arrays And Methods Used In Forming A Memory Array Comprising Strings Of Memory Cells", the disclosure of which is incorporated by reference.

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3-20 are diagrammatic sequential sectional and/or enlarged views of the construction of FIGS. 1 and 2, or portions thereof, in process in accordance with some embodiments of the invention.

DETAILED DESCRIPTION OF EXAMPLE EMBODIMENTS

Figure 5:
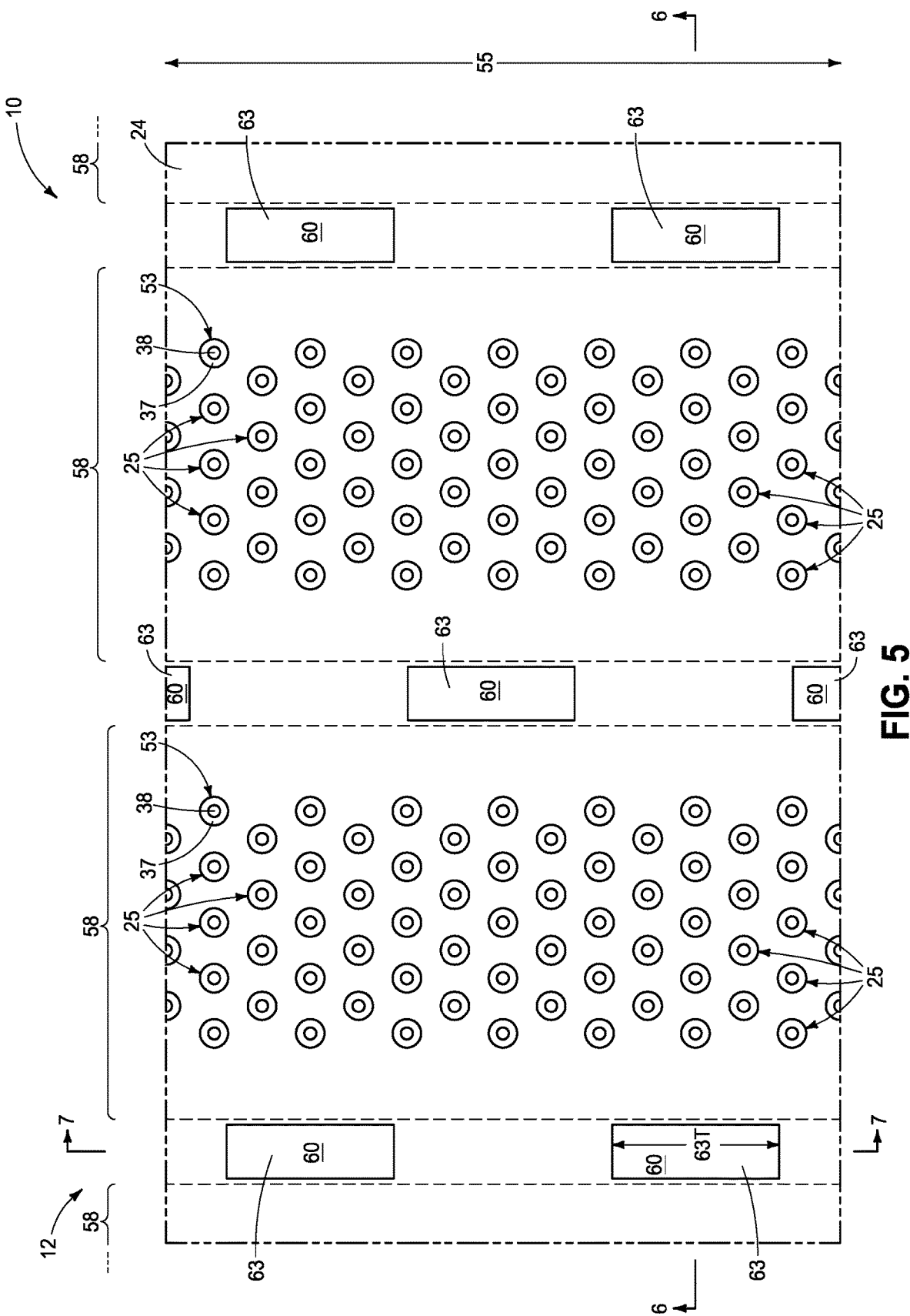

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-20 which may be considered as a "gate-last" or "replacement-gate" process.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Uppermost insulative tier 20 may be considered as having a top surface 21.

Channel openings 25 have been formed (e.g., by etching) through insulative tiers 20 and conductive tiers 22 to conductor tier 16. In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being horizontally longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 3, 3A, 4, and 4A show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along insulative tiers 20 and conductive tiers 22, thus comprising individual operative channel-material strings 53. Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop channel-material strings 53 for better conductive connection to overlying circuitry (not shown).

Intervening material is formed into stack 18 laterally-between and longitudinally-along immediately-laterally-adjacent memory block regions 58. Example embodiments of doing so are next described with reference to FIGS. 5-20.

Referring to FIGS. 5-7, pillars 60, in some embodiments referred to as first pillars 60, have been formed laterally-between and longitudinally-spaced-along immediately-laterally-adjacent memory-block regions 58. Pillars 60 individually extend through multiple of each of insulative tiers 20 and conductive tiers 22 and in one embodiment through at least a majority of insulative tiers 20 and conductive tiers 22 through which channel-material strings 53 extend. In the example embodiment, pillars 60 extend through all insulative tiers 20 and conductive tiers 22 through which channel-material strings 53 extend. An example manner of forming pillars 60 is by etching an opening through stack 18 to have the example outline of pillars 60 as shown. Pillars 60 and other pillars described below may remain in a finished construction of the memory array or may all be removed so that they do not remain in the finished construction. If being all removed, conductive/semiconductive/insulative properties of pillars 60 are immaterial. If pillars 60 remain in the finished construction of the memory array, conductive/semiconductive/insulative property of pillars 60 may be of significance. Regardless, in one embodiment, pillars 60 individually are everywhere insulative. In another embodiment, pillars 60 individually have insulative horizontal peripheries vertically there-along and individually have vertically-extending core material (not shown) radially-inward of the insulative horizontal peripheries and at least some of which is at least one of semiconductive and conductive. Pillars 60 may at least initially be formed as shown to be wider at their tops 63 (dimension 63T) than at their bottoms 64 (dimension 64B) in direction 55 of horizontal-longitudinal-orientation of memory blocks 58.

Figure 8:
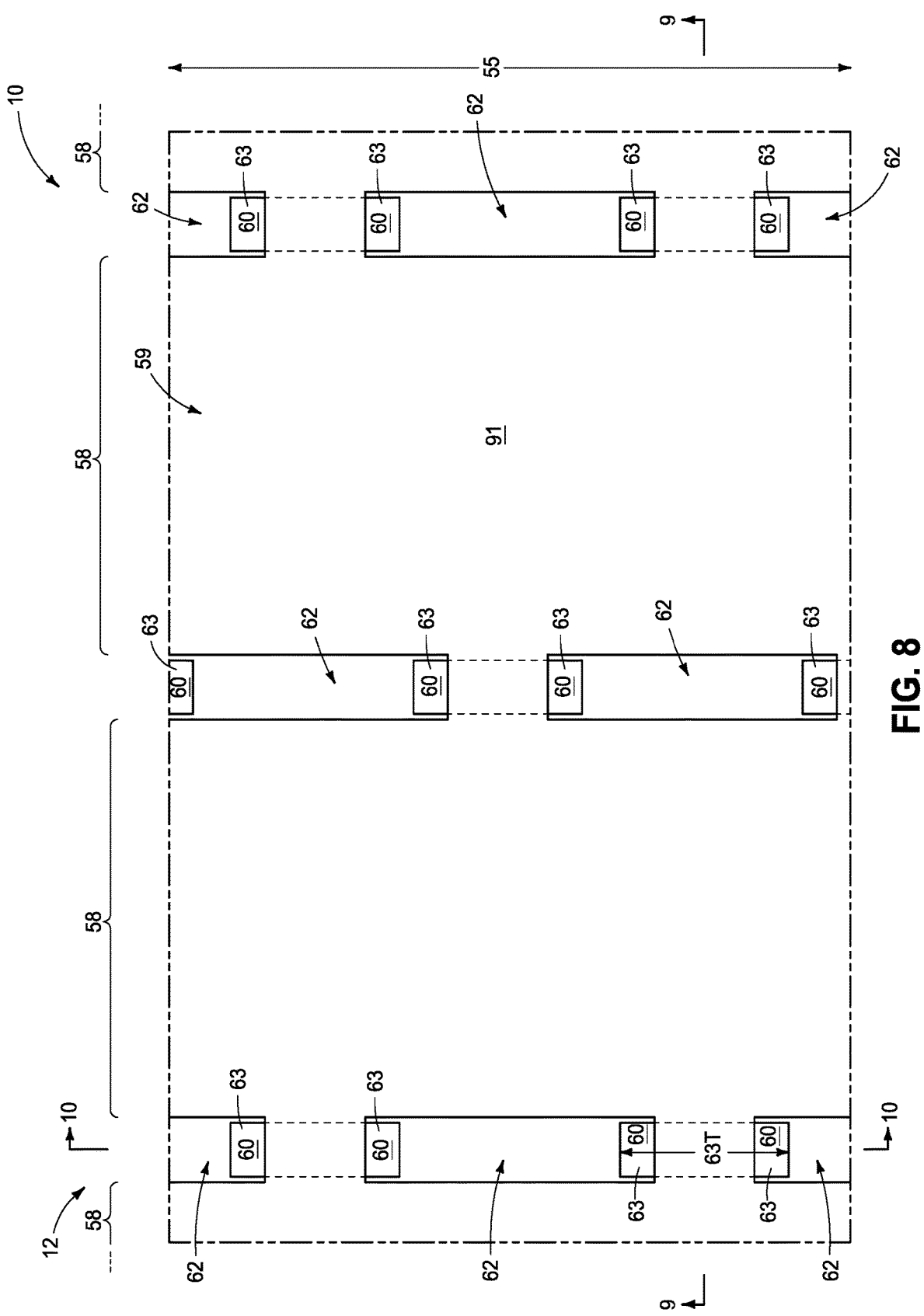
Figure 9:
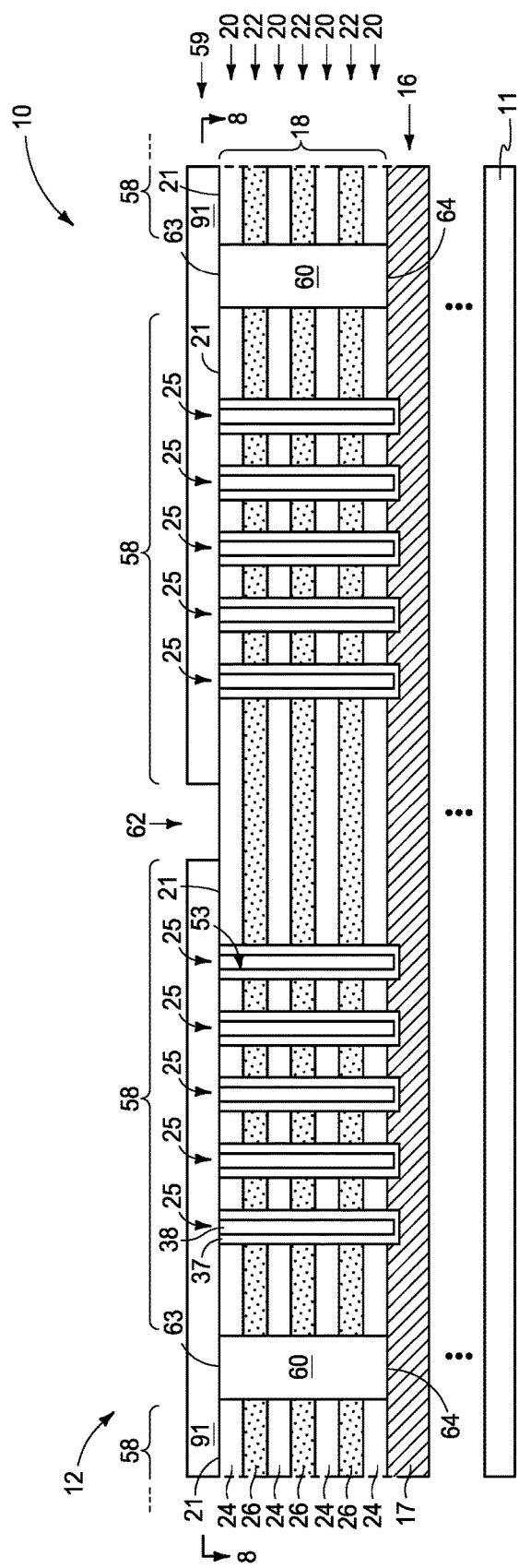
Figure 10:
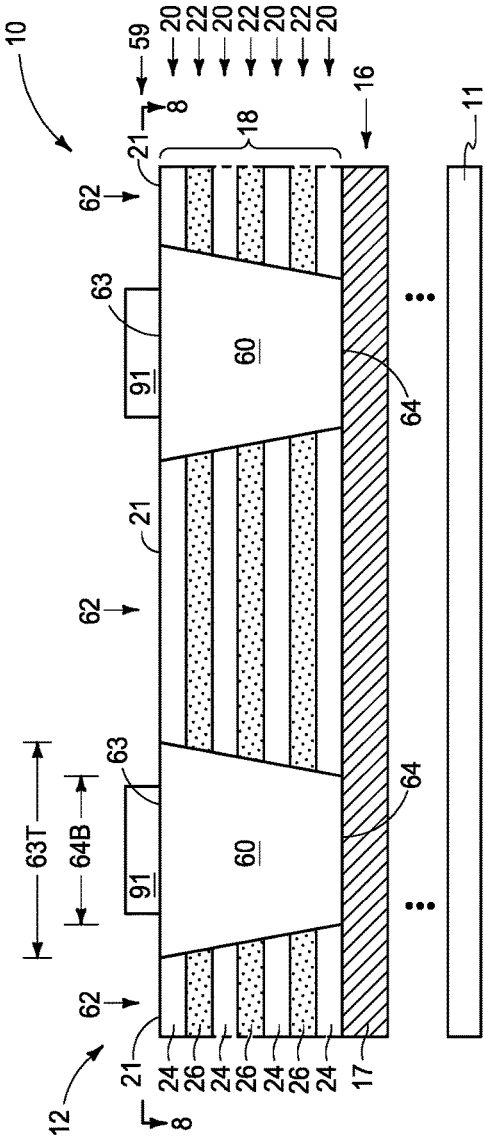

Referring to FIGS. 8-10, and in one embodiment, a mask 59 comprising masking material 91 (e.g., photoresist) and individual mask openings 62 has been formed over stack 18. Individual mask openings 62 horizontally overlap at least a portion of horizontal-longitudinal length 63T of tops 63 of immediately-longitudinally-adjacent pillars 60 in direction 55. In one such embodiment and as shown, individual mask opening 62 horizontally overlap only a portion of horizontal-longitudinal length 63T of tops 63 of immediately-longitudinally-adjacent pillars 60 in direction 55.

Figure 11:
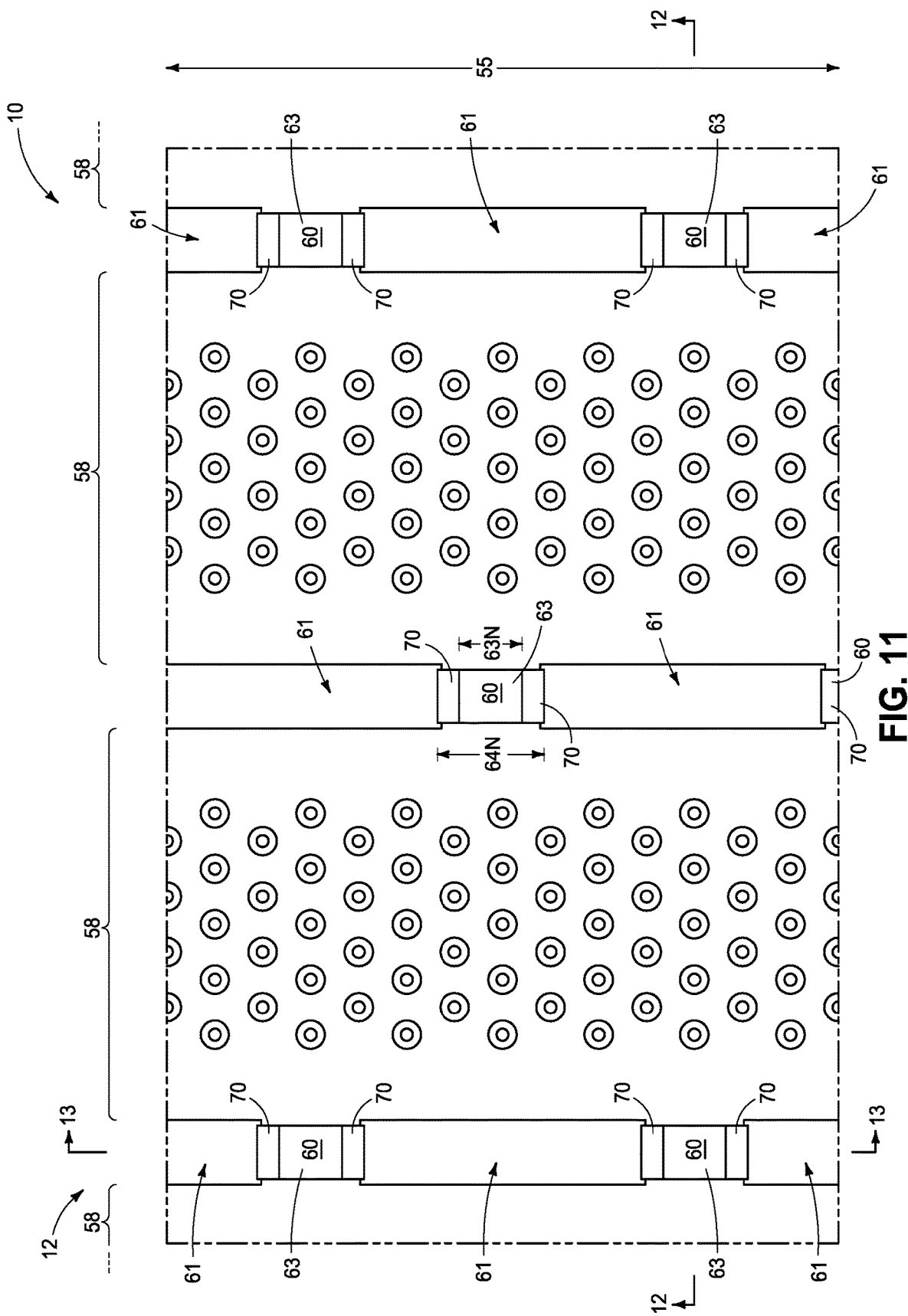
Figure 12:
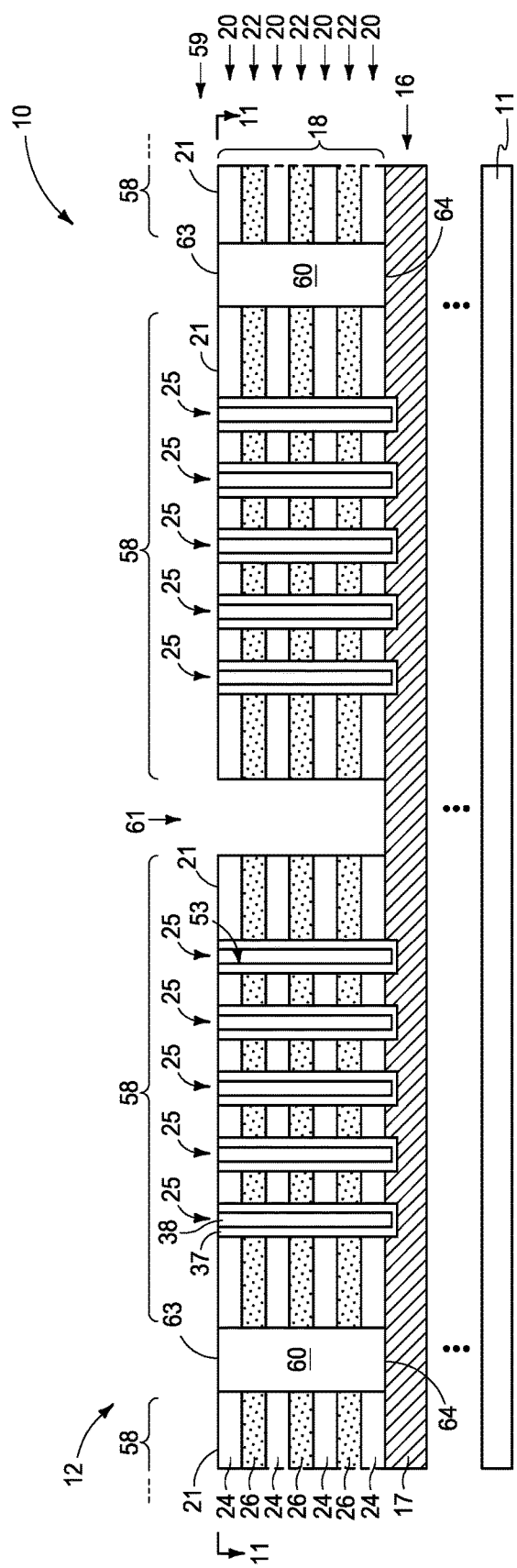
Figure 13:
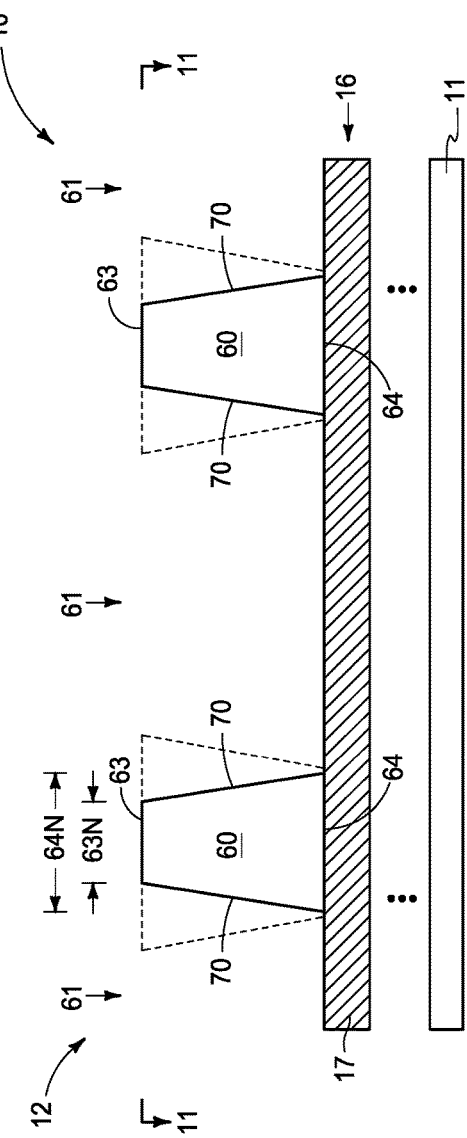
Figure 14:
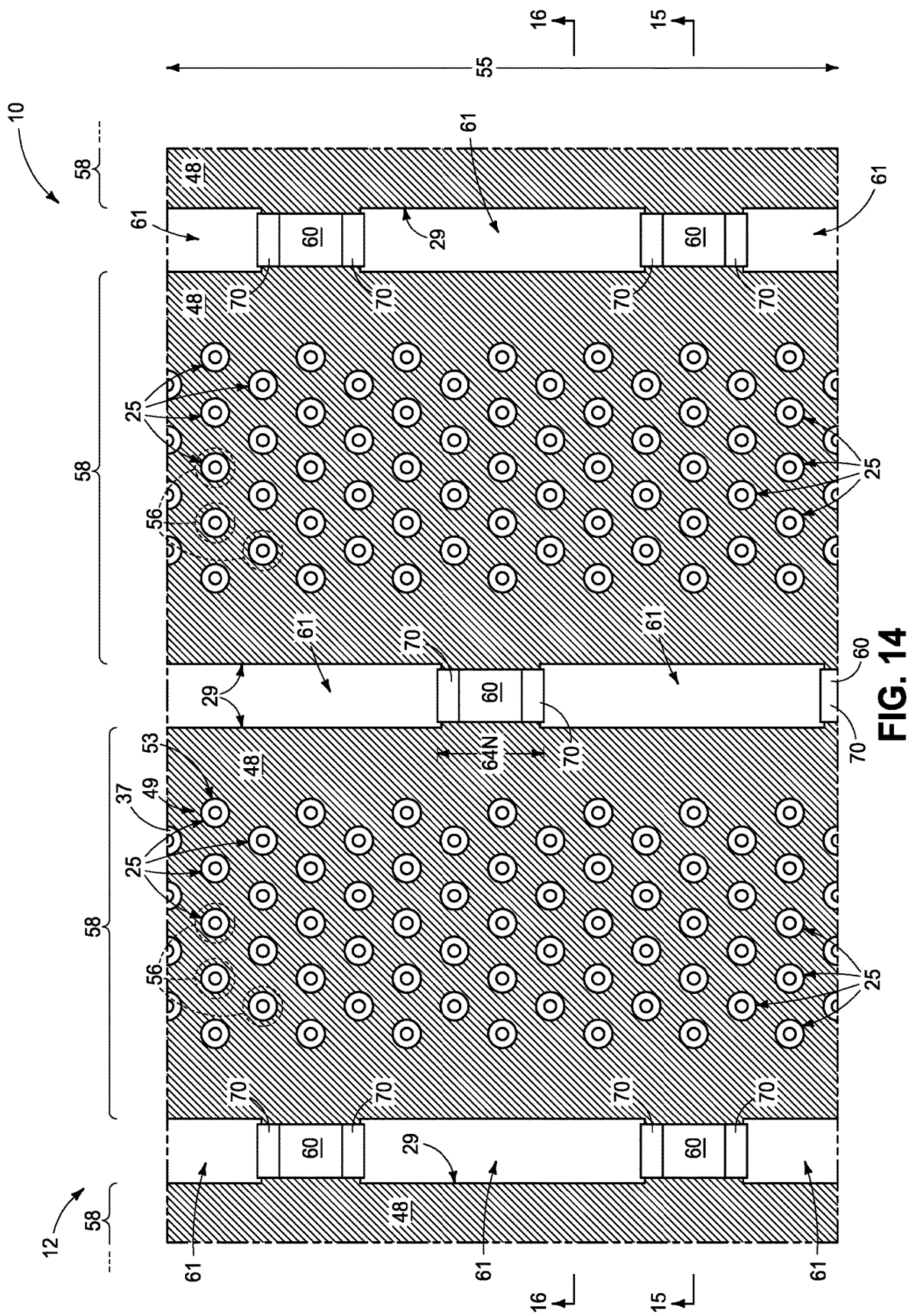
Figure 15:
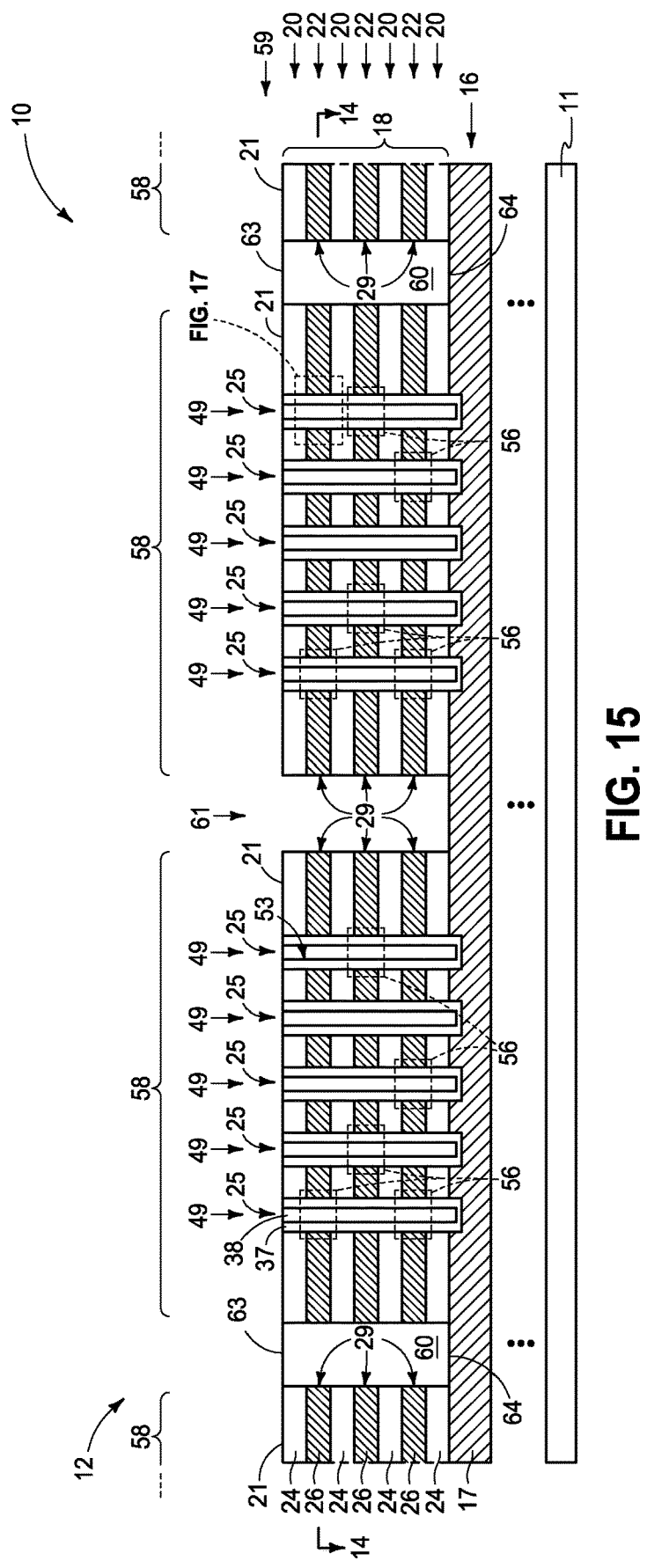
Figure 16:
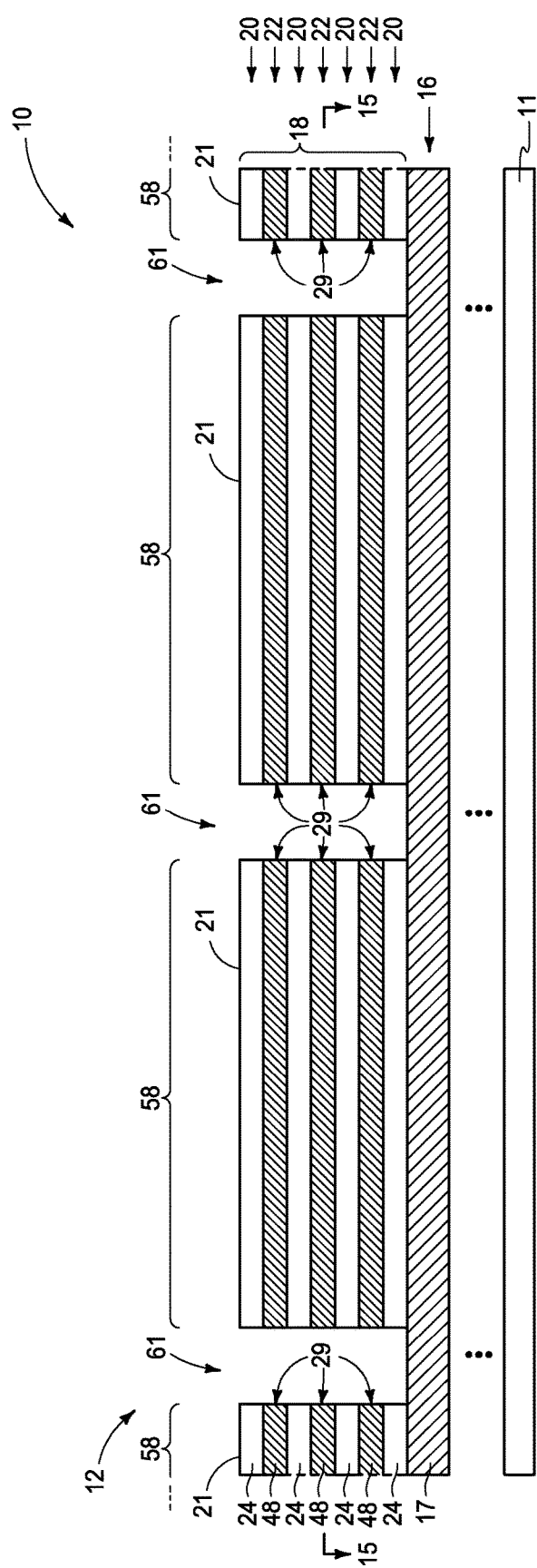
Figure 17:
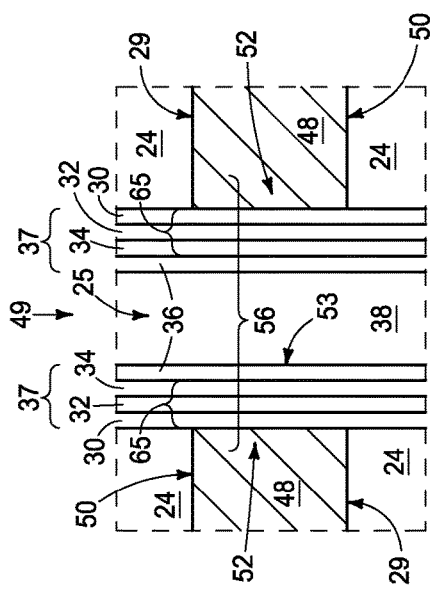

Referring to FIGS. 11-13, after forming pillars 60, mask 59 (not shown) has been used to form an intervening opening 61 (e.g., by etching through the mask openings) individually alongside and between immediately-longitudinally-adjacent pillars 60, and then mask 59 (not shown) has been removed. In one embodiment and as shown, intervening opening 61 horizontally-spans (i.e., completely) longitudinally-between immediately-longitudinally-adjacent pillar 60. Alternately, by way of example, multiple intervening openings that are spaced relative one another (not shown) in direction 55 may be between immediately-longitudinally-adjacent pillars 60. Regardless, and in one embodiment, intervening openings 61 are formed using a mask (e.g., 59) comprising a mask opening (e.g., 62) that is not longitudinally-continuous all along and laterally-between immediately-laterally-adjacent memory block regions 58. In one embodiment, the act of forming intervening openings 61 results in forming pillars 60 to individually be wider at their bottoms 64 (new dimension 64N) than at their tops 63 (new dimension 63N) in direction 55, and forms pillar sides 70. Outlines of original pillars 60 are shown in FIG. 13 in dashed lines. Such transformation may occur, for example, as uppermost portions of pillars 60 are exposed longer to etching chemistry to form intervening openings 61 than are lowest portions of pillars 60. Some of bottoms 64 may also laterally recess slightly as shown. Alternately considered, mask openings 62 of mask 59 are formed sufficiently long to assure that if some lateral recessing of lowest portions of pillars 60 occurs, such is sufficient to assure complete etching through stack 18 in FIG. 13 (as shown) when forming intervening openings 61.

The above processing shows forming and filling channel openings 25 prior to forming pillars 60. Such could be reversed. Alternately, pillars 60 could be formed in between the forming and filling of channel openings 25 (not ideal). Any order of fabrication may be used to form all of the features of the example construction 10 as shown in FIGS. 11-13. Further, and regardless, one or more masks used to form openings in which pillars 60 are received and/or to form intervening openings 61 may be combined with other masks, for example a mask used to form through-array-via openings (not shown).

Referring to FIGS. 14-17, and in one embodiment, material 26 (not shown) of conductive tiers 22 has been removed, for example by being isotropically etched away through intervening openings 61 ideally selectively relative to the other exposed materials (e.g., insulative tiers 20 and pillars 60) (e.g., using liquid or vapor $H_3PO_4$ as a primary etchant where material 26 is silicon nitride, and other materials comprise one or more oxides or polysilicon). Material 26 (not shown) in conductive tiers 22 in the example embodiment is sacrificial and has been replaced with conducting material 48, and which has thereafter been removed from intervening openings 61, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 14 and some with dashed outlines in FIGS. 14 and 15, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 17) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming pillars 61. Alternately, the conducting material of the conductive tiers may be formed before forming pillars 61 and/or before forming channel openings 25 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conducting material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 18:
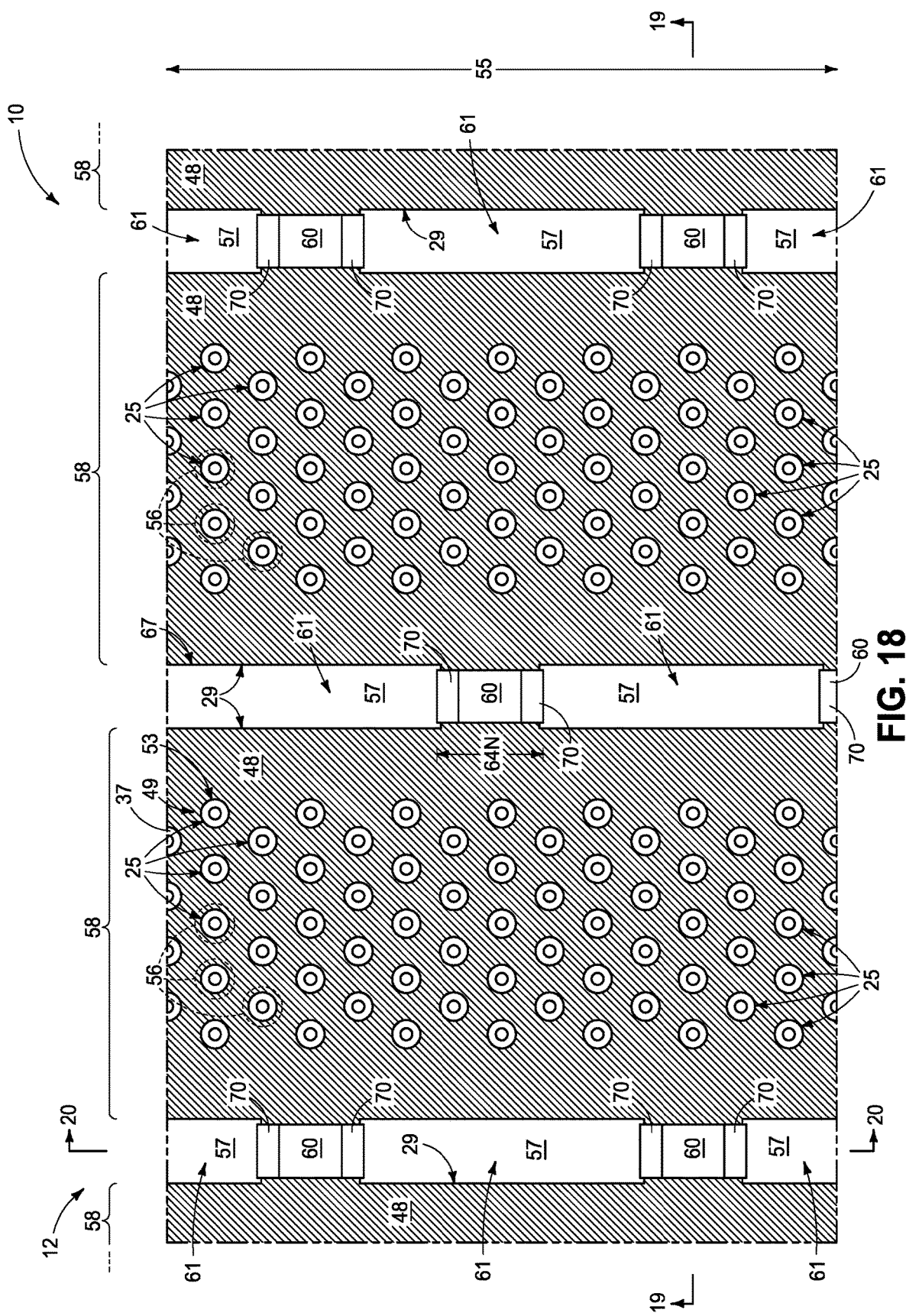
Figure 19:
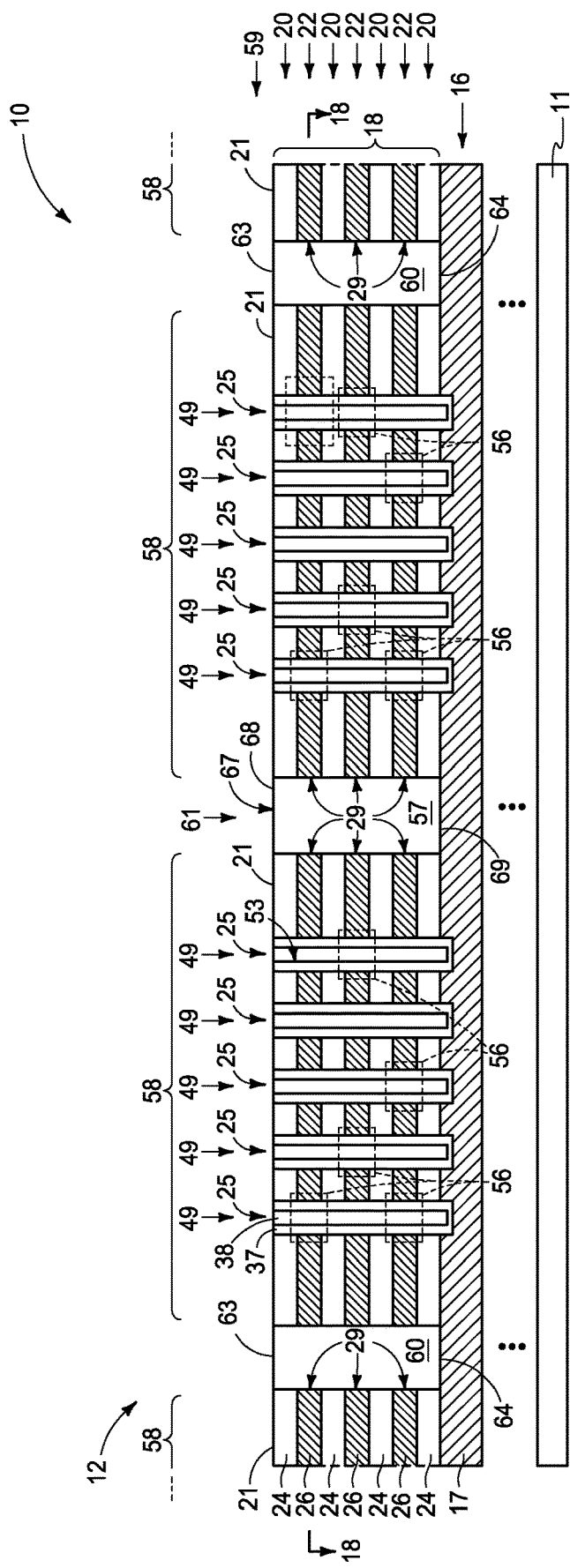
Figure 20:
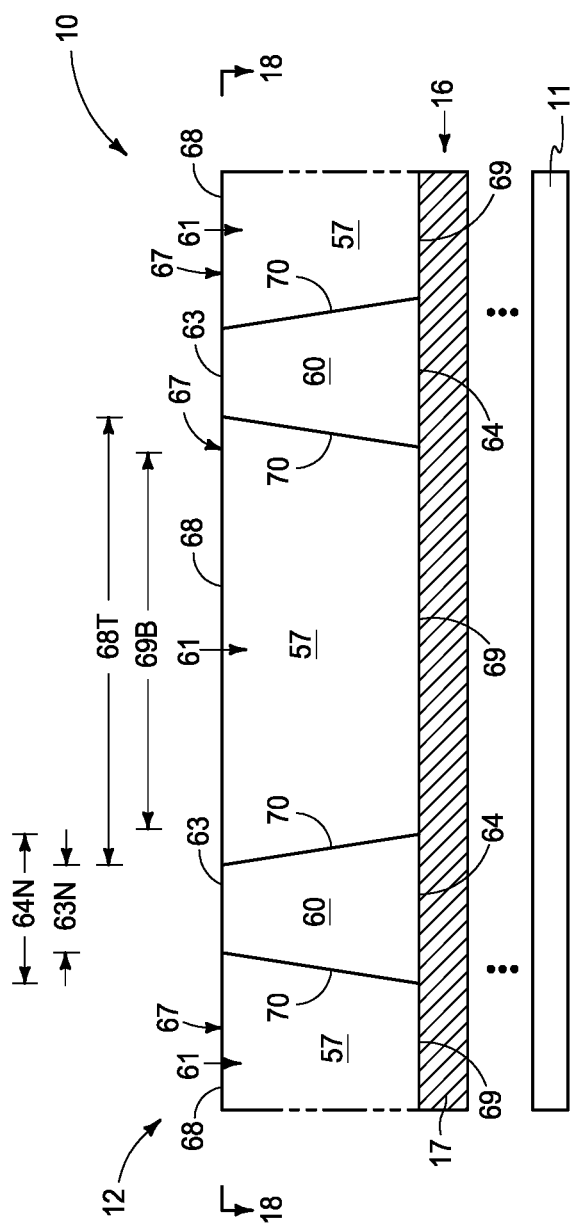

Referring to FIGS. 18-20, fill material 57 has been formed in intervening opening 61, and in one embodiment as shown with such being formed to fill intervening openings 61 to form an individual pillar 67, in some embodiments referred to as a second pillar 67, in individual intervening openings 61. In one such embodiment, pillars 60 (e.g., first pillars 60) and pillars 67 (e.g., second pillars 67) longitudinally-alternate relative one another laterally-between immediately-laterally-adjacent memory-block regions 58. In one embodiment and as shown, pillars 67 have been formed to individually be wider at their tops 68 (dimension 68T) than at their bottoms 69 (dimension 69B) in direction 55. In some embodiments, fill material 57 may be considered as intervening material. Pillars 60 and pillars 67 may also be considered as intervening material. Such intervening material 57/60/67 may provide lateral electrical isolation (insulation) between immediately-laterally-adjacent memory-blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In one embodiment, intervening material 57 comprises a laterally-outermost insulative material (e.g., silicon dioxide and/or silicon nitride and not shown) and a laterally-inner material (e.g., undoped polysilicon and not shown) of different composition from that of the laterally-outermost insulative material. In one embodiment, intervening material 57/60/67 is everywhere insulative between the immediately-laterally-adjacent memory blocks.

Any other attribute(s) or aspect(s) as shown and/or described herein with respect to other embodiments may be used with respect to the above-described embodiments.

Figure 21:
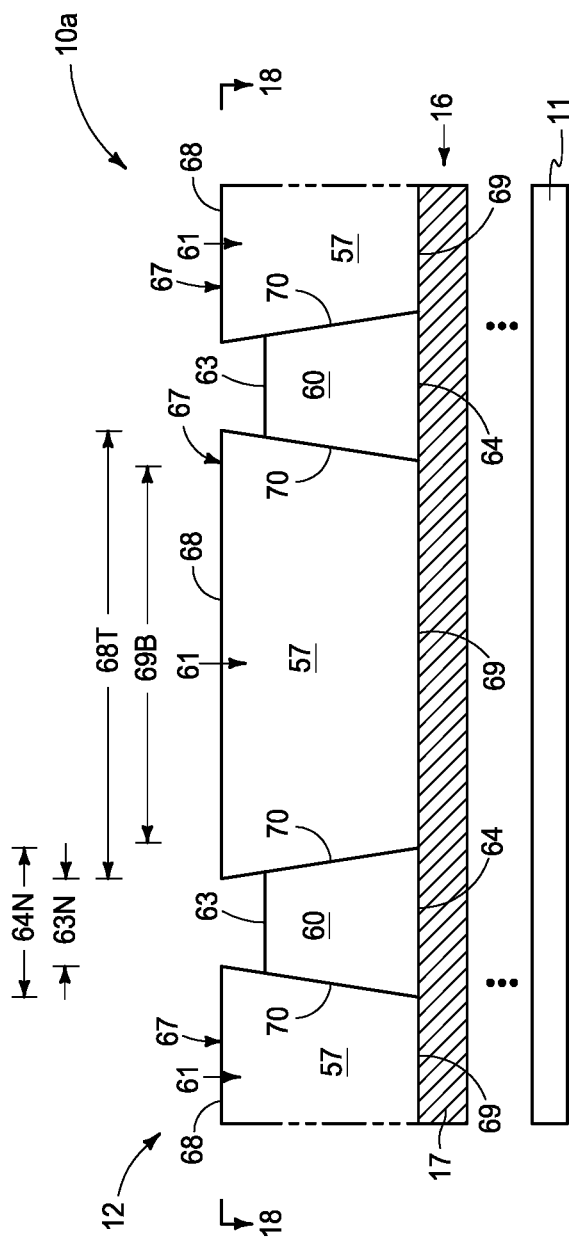
FIGS. 21-23 are diagrammatic cross-sectional views of a portion of a substrate in accordance with embodiments of the invention.

FIGS. 18-20 show example embodiments where pillars 60 and 67 vertically extend completely between the top and bottom of stack 18. Alternately, such may not so extend. For example, and by way of example only, an alternate example construction 10a is shown in FIG. 21. Like numerals from the above-described embodiments have been used where appropriate, with some construction differences being indicated with the suffix "a" or with different numerals. FIG. 21 shows an example array 12 where pillars 60a have their tops 63 recessed vertically relative to the top of the stack. Analogously and/or alternately, pillars 67 may have their tops recessed (not shown) regardless of any recessing of pillars 60/60a, and if both are vertically recessed such may be to the same or different depth(s). Any other attribute(s) or aspect(s) as shown and/or described herein with respect to other embodiments may be used.

Figure 22:
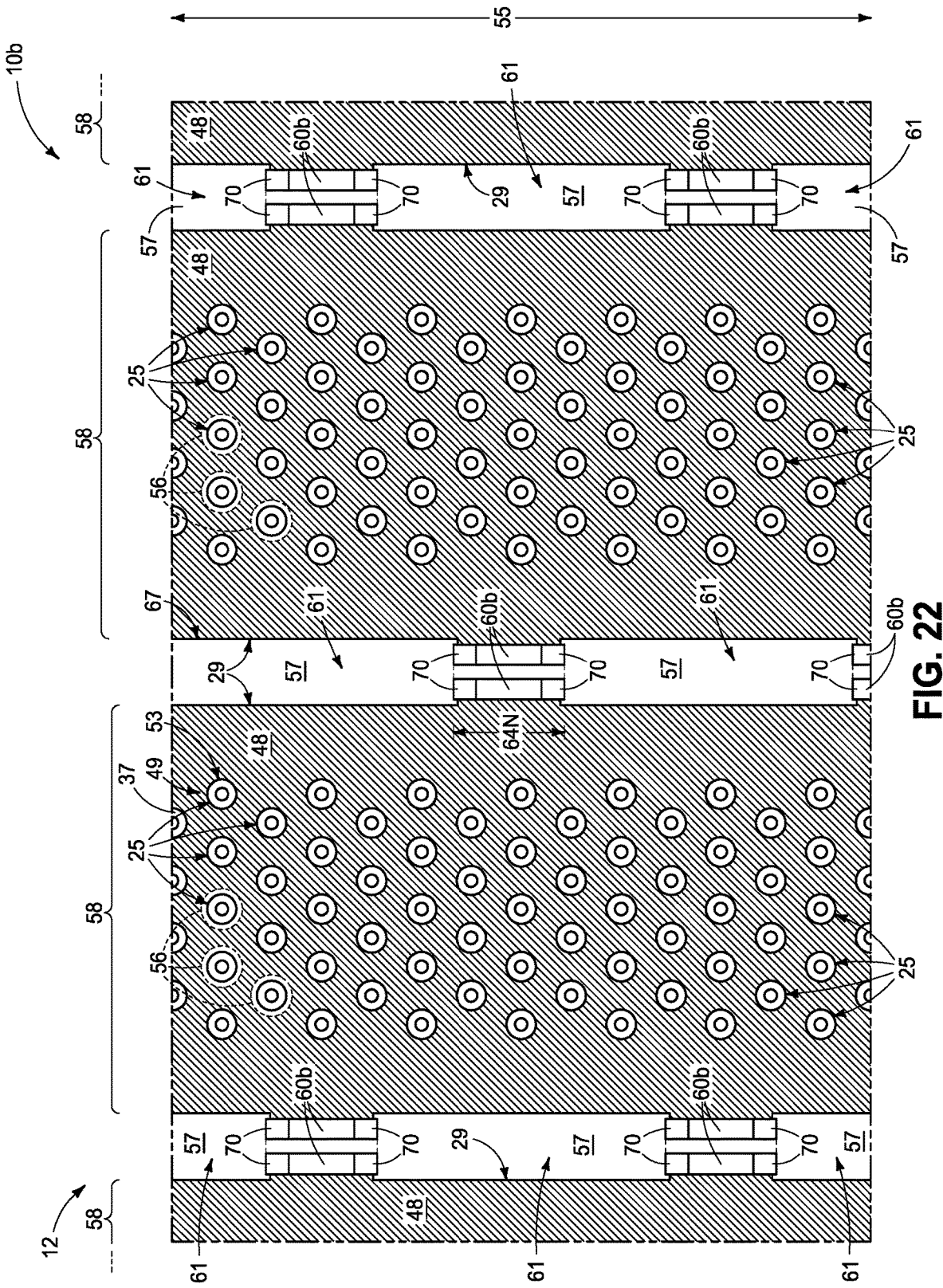

FIG. 22 shows an example alternate embodiment construction 10b corresponding in horizontal cross-section to that of FIG. 18. Like numerals from the above-described embodiments have been used where appropriate, with some construction differences being indicated with the suffix "b" or with different numerals. Example construction 10b has multiple side-by-side pillars 60b laterally-between immediately-laterally-adjacent memory blocks 58 orthogonal to direction 55, and in one embodiment where side-by-side pillars 60b are not directly against one another. In one embodiment and as shown, side-by-side pillars 60b have the same horizontal-cross-sectional peripheral shape. Any other attribute(s) or aspect(s) as shown and/or described herein with respect to other embodiments may be used.

Figure 23:
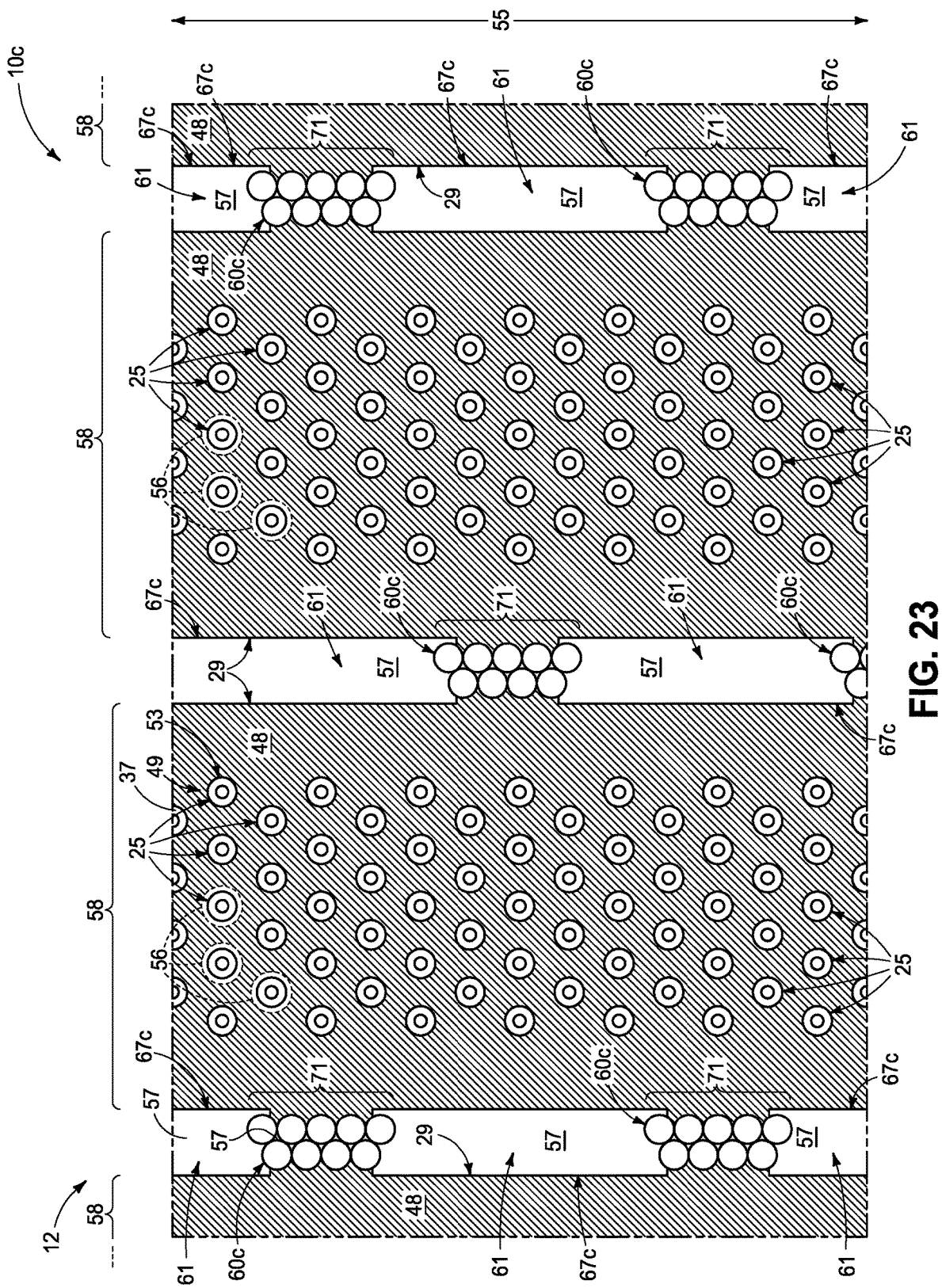

FIG. 23 shows an alternate example construction 10c. Like numerals from the above-described embodiments have been used where appropriate, with some construction differences being indicated with the suffix "c" or with different numerals. Example construction 10c also has multiple immediately-adjacent side-by-side pillars 60c but which in this example that are directly against one another. Such further, by way of example only, shows an embodiment where multiple pillars 60c comprise groups 71 of a plurality of such pillars, with the groups being longitudinally-spaced from one another along immediately-laterally-adjacent memory blocks 58. Other pillars (e.g., 67c) are individually between immediately-longitudinally-adjacent groups 71 of pillars 60c, with in one embodiment where there is one and only one of such other pillars (e.g., 67c) between immediately-longitudinally-adjacent groups 71 of pillars 61c. Any of the attributes of constructions 10, 10a, 10b, and/or 10c can be combined (not shown). Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

An embodiment of the invention includes a memory array (e.g., 12) comprising strings (e.g., 49) of memory cells (e.g., 56) comprising laterally-spaced memory blocks (e.g., 58)

individually comprising a vertical stack (e.g., 18) comprising alternating insulative tiers (e.g., 20) and conductive tiers (e.g., 22). Operative channel-material strings (e.g., 53) of the memory cells extend through the insulative tiers and the conductive tiers. Intervening material (e.g., 57/60,60*b*,60*c*/ 67,67*c*) is laterally-between and longitudinally-along immediately-laterally-adjacent memory blocks 58. The intervening material comprises at least one pillar (e.g., 60, 60*b*, 60*c*) extending through at least a majority of the insulative tiers and the conductive tiers through which the channel-material strings extend. The at least one pillar is wider at its bottom (e.g., 64) than at its top (e.g., 63) in direction (e.g., 55) of horizontal-longitudinal-orientation of the memory blocks. In one embodiment, the at least one pillar is directly against sides of the immediately-laterally-adjacent memory blocks. Any other attribute(s) or aspect(s) as shown and/or described herein with respect to other embodiments may be used.

An embodiment of the invention includes a memory array (e.g., 12) comprising strings (e.g., 49) of memory cells (e.g., 56) comprising laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of the memory cells extend through the insulative tiers and the conductive tiers. Intervening material (e.g., 57/60,60*b*,60*c*/ 67,67*c*) is laterally-between and longitudinally-along immediately-laterally-adjacent memory blocks 58. The intervening material comprises longitudinally-alternating first and second regions (e.g., respectively encompassing the different pillar types) individually comprising at least one pillar extending through at least a majority of the insulative tiers and the conductive tiers through which the channel-material strings extend. The at least one first-region pillar or the at least one second-region pillar is wider at its bottom than at its top in direction (e.g., 55) of horizontal-longitudinal-orientation of the memory blocks. In one such embodiment, the at least one first-region pillar or the at least one second-region pillar is horizontally-longest in the direction than orthogonally to the direction. Any other attribute(s) or aspect(s) as shown and/or described herein with respect to other embodiments may be used.

An embodiment of the invention includes a memory array (e.g., 12) comprising strings (e.g., 49) of memory cells (e.g., 56) comprising laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of the memory cells extend through the insulative tiers and the conductive tiers. Intervening material (e.g., 57/60,60*b*,60*c*/ 67,67*c*) is laterally-between and longitudinally-along immediately-laterally-adjacent memory blocks 58. The intervening material comprises longitudinally-alternating first and second pillars (e.g., 60/60*b*/60*c* and 67,67*c* respectively) individually extending through at least a majority of the insulative tiers and the conductive tiers through which the channel-material strings extend. The first pillars individually are wider at their bottoms (e.g., 64) than at their tops (e.g., 63) in direction (e.g., 55) of horizontal-longitudinal-orientation of the memory blocks. The second pillars individually are wider at their tops (e.g., 68) than at their bottoms (e.g., 69) in the direction. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers. Intervening material is formed into the stack laterally-between and longitudinally-along immediately-laterally-adjacent memory block regions. The forming of the intervening material comprises forming pillars laterally-between and longitudinally-spaced-along the immediately-laterally-adjacent memory-block regions. The pillars individually extend through multiple of each of the first tiers and the second tiers. After forming the pillars, an intervening opening is formed individually alongside and between immediately-longitudinally-adjacent of the pillars. Fill material is formed in the intervening openings.

In some embodiments, a method used in forming a memory array comprising strings of memory cells comprises forming a stack comprising vertically-alternating first tiers and second tiers. Intervening material is formed into the stack laterally-between and longitudinally-along immediately-laterally-adjacent memory block regions. The forming of the intervening material comprises forming first pillars laterally-between and longitudinally-spaced-along the immediately-laterally-adjacent memory-block regions. The first pillars individually extend through multiple of each of the first tiers and the second tiers. After forming the first pillars, an intervening opening is formed individually alongside and horizontally-spanning longitudinally-between immediately-longitudinally-adjacent of the first pillars. The intervening openings are filled with fill material to form an individual second pillar in individual of the intervening openings. The first and second pillars are longitudinally-alternating relative one another laterally-between the immediately-laterally-adjacent memory-block regions.

In some embodiments, a method used in forming a memory array comprising strings of memory cells comprises forming a stack comprising vertically-alternating first tiers and second tiers. The first tiers comprise sacrificial material and the stack comprises laterally-spaced memory-block regions. Pillars are formed laterally-between and longitudinally-spaced-along the immediately-laterally-adjacent memory-block regions and individually extend through multiple of each of the first tiers and the second tiers. After forming the pillars, an opening is formed individually alongside and between immediately-longitudinally-adjacent of the pillars. Through the openings, the sacrificial material that is in the first tiers is isotropically etched away and replaced with conducting material of individual conductive lines. Intervening material is formed in the openings after the etching In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent of the memory blocks. The intervening material comprises at least one pillar extending through at least a majority of the insulative tiers and the conductive tiers through which the channel-material strings extend. The at least one pillar is wider at its bottom than at its top in direction of horizontal-longitudinal-orientation of the memory blocks.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent of the memory blocks. The intervening material comprises longitudinally-alternating first and second regions individually comprising at least one pillar extending through at least a majority of the insulative tiers and the conductive tiers through which the channel-material strings extend. The at least one first-region pillar or the at least one second-region pillar is wider at its bottom than at its top in direction of horizontal-longitudinal-orientation of the memory blocks.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent memory blocks. The intervening material comprises longitudinally-alternating first and second pillars that individually extend through at least a majority of the insulative tiers and the conductive tiers through which the channel-material strings extend. The first pillars individually are wider at their bottoms than at their tops in direction of horizontal-longitudinal-orientation of the memory blocks. The second pillars individually are wider at their tops than at their bottoms in said direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
   laterally-spaced memory blocks individually comprising a vertical stack comprising alternating insulative tiers and conductive tiers, operative channel-material strings of memory cells extending through the insulative tiers and the conductive tiers; and
   intervening material laterally-between and longitudinally-along immediately-laterally-adjacent of the memory blocks, the intervening material comprising at least one pillar extending through at least a majority of the insulative tiers and the conductive tiers through which the channel-material strings extend, the at least one pillar being wider at its bottom than at its top in a direction of horizontal and longitudinal orientation of the memory blocks, immediately-adjacent of side-by-side pillars being directly against one another.

2. The memory array of claim 1 wherein the at least one pillar is horizontally-longest in said direction than orthogonally to said direction.

3. The memory array of claim 1 wherein the at least one pillar is directly against sides of the immediately-laterally-adjacent memory blocks.

4. The memory array of claim 1 comprising multiple side-by-side of the pillars laterally-between the immediately-laterally-adjacent memory blocks orthogonal said direction.

5. The memory array of claim 4 wherein the side-by-side pillars have the same horizontal-cross-sectional peripheral shape.

6. The memory array of claim 1 comprising multiple of said pillars that are longitudinally-spaced from one another along the immediately-laterally-adjacent memory blocks.

7. The memory array of claim 1 comprising NAND flash memory.

8. A memory array comprising strings of memory cells, comprising:
   laterally-spaced memory blocks individually comprising a vertical stack comprising alternating insulative tiers and conductive tiers, operative channel-material strings of memory cells extending through the insulative tiers and the conductive tiers;
   intervening material laterally-between and longitudinally-along immediately-laterally-adjacent of the memory blocks, the intervening material comprising at least one pillar extending through at least a majority of the insulative tiers and the conductive tiers through which the channel-material strings extend, the at least one pillar being wider at its bottom than at its top in a direction of horizontal and longitudinal orientation of the memory blocks; and
   comprising multiple of said pillars that are longitudinally-spaced from one another along the immediately-laterally-adjacent memory blocks, said multiple of said pillars comprises groups of a plurality of said pillars, the groups being longitudinally-spaced from one another along the immediately-laterally-adjacent memory blocks, the groups individually comprising said plurality of said pillars that are side-by-side orthogonal said direction.

9. The memory array of claim 6 comprising other pillars that are individually between immediately-longitudinally-adjacent of said multiple pillars.

10. The memory array of claim 9 wherein said other pillars are individually wider at their tops than at their bottoms in said direction.

11. The memory array of claim 10 comprising one and only one of said other pillars between immediately-longitudinally-adjacent of said multiple pillars.

12. A memory array comprising strings of memory cells, comprising:
- laterally-spaced memory blocks individually comprising a vertical stack comprising alternating insulative tiers and conductive tiers, operative channel-material strings of memory cells extending through the insulative tiers and the conductive tiers; and
- intervening material laterally-between and longitudinally-along immediately-laterally-adjacent of the memory blocks, the intervening material comprising longitudinally-alternating first and second regions individually comprising at least one pillar extending through at least a majority of the insulative tiers and the conductive tiers through which the channel-material strings extend, the at least one first-region pillar or the at least one second-region pillar being wider at its bottom than at its top in a direction of horizontal and longitudinal orientation of the memory blocks.

13. The memory array of claim 12 wherein said at least one first-region pillar or said at least one second-region pillar is horizontally-longest in said direction than orthogonally to said direction.

14. A memory array comprising strings of memory cells, comprising:
- laterally-spaced memory blocks individually comprising a vertical stack comprising alternating insulative tiers and conductive tiers, operative channel-material strings of memory cells extending through the insulative tiers and the conductive tiers; and
- intervening material laterally-between and longitudinally-along immediately-laterally-adjacent memory blocks, the intervening material comprising longitudinally-alternating first and second pillars individually extending through at least a majority of the insulative tiers and the conductive tiers through which the channel-material strings extend, the first pillars individually being wider at their bottoms than at their tops in a direction of horizontal and longitudinal orientation of the memory blocks, the second pillars individually being wider at their tops than at their bottoms in said direction.

15. The memory array of claim 14 wherein the first pillars individually are everywhere insulative.

16. The memory array of claim 14 wherein the first pillars individually have insulative horizontal peripheries vertically there-along and individually have core material radially-inward of the insulative horizontal peripheries at least some of which is at least one of semiconductive and conductive.

17. The memory array of claim 14 wherein the second pillars individually are everywhere insulative.

18. The memory array of claim 14 wherein the second pillars individually have insulative horizontal peripheries vertically there-along and individually have core material radially-inward of the insulative horizontal peripheries at least some of which is at least one of semiconductive and conductive.

* * * * *